United States Patent [19]
Portelli et al.

[11] Patent Number: 5,405,686
[45] Date of Patent: Apr. 11, 1995

[54] ARTICLE COATED WITH KURED HOMOGENEOUS THERMOSET RESIN/THERMOPLASTIC PARTICLES

[75] Inventors: Gene B. Portelli, Woodbury; William J. Schultz, Vadnais Heights; John T. Boden, White Bear Lake; Daniel M. Kaufer, Scandia; all of Minn.

[73] Assignee: Minnesota Mining and Manufacturing Company, St. Paul, Minn.

[21] Appl. No.: 269,825

[22] Filed: Jul. 1, 1994

Related U.S. Application Data

[60] Division of Ser. No. 147,638, Nov. 4, 1993, which is a division of Ser. No. 808,019, Dec. 13, 1991, Pat. No. 5,276,106, which is a continuation-in-part of Ser. No. 596,796, Oct. 12, 1990, Pat. No. 5,067,564, which is a continuation-in-part of Ser. No. 467,729, Jan. 19, 1990, abandoned.

[51] Int. Cl.$^6$ .................. B32B 15/08; B32B 17/10; B32B 19.04; B32B 27/12
[52] U.S. Cl. .................. 428/229; 428/245; 428/260; 428/290; 428/412; 428/417; 428/418; 428/423.7; 428/424.2; 428/425.5; 428/425.8; 428/458; 428/473.5; 428/475.2; 428/475.8; 428/483; 428/500
[58] Field of Search .............. 428/229, 290, 245, 260, 428/412, 423.7, 424.2, 425.5, 425.8, 417, 418, 458, 473.5, 475.2, 475.8, 483, 500, 902; 523/435, 440, 443, 444; 524/80, 443, 445, 493, 494, 495, 500, 513, 514, 537, 538, 539

[56] References Cited

U.S. PATENT DOCUMENTS

| | | | |
|---|---|---|---|
| 3,784,433 | 1/1974 | Garnish et al. | 156/276 |
| 3,925,300 | 12/1975 | Roberts et al. | 260/40 R |
| 4,048,257 | 9/1977 | Stevenson | 260/862 |
| 4,096,107 | 6/1978 | Roberts | 260/33.6 |
| 4,157,360 | 6/1979 | Prevorsek et al. | 260/860 |
| 4,430,479 | 2/1984 | Merton et al. | 525/127 |
| 4,451,506 | 5/1984 | Kobayashi et al. | 427/239 |
| 4,468,497 | 8/1984 | Street et al. | 525/422 |
| 4,478,963 | 10/1984 | McGarry | 523/205 |
| 4,524,181 | 6/1985 | Adam et al. | 525/107 |
| 4,558,078 | 12/1985 | Draney et al. | 523/468 |
| 4,668,736 | 5/1987 | Robins et al. | 525/65 |
| 4,704,331 | 11/1987 | Robins et al. | 428/414 |
| 4,745,215 | 5/1988 | Cox et al. | 560/301 |
| 4,780,507 | 10/1988 | Gaku et al. | 525/113 |
| 4,804,740 | 2/1989 | Gardner et al. | 528/422 |
| 4,846,905 | 7/1989 | Tarbutton et al. | 525/65 |
| 4,954,195 | 9/1990 | Turpin | 156/242 |
| 5,002,821 | 3/1991 | Browne et al. | 428/246 |

FOREIGN PATENT DOCUMENTS

| | | |
|---|---|---|
| 0108476 | 5/1984 | European Pat. Off. . |
| 0266986 | 5/1988 | European Pat. Off. . |
| 0274899 | 7/1988 | European Pat. Off. . |
| 0301361 | 7/1989 | European Pat. Off. . |
| 0392348 | 10/1992 | European Pat. Off. . |
| WO90/09410 | 8/1990 | WIPO . |
| WO91/02029 | 2/1991 | WIPO . |

OTHER PUBLICATIONS

Chemical Patents Index, Basic Abstracts Journal, Section Ch, Week 8806, 6 Apr. 1988 (Derwent Publications Ltd., London, GB; Class An AN 88-039225(06) and JP-A-62 297 316 (Toray Ind.Inc.) 24 Dec. 1987.
Blair et al., 33rd Int'l SAMPE Symposium, Mar. 7–10, 1988, "The Toughening Effects of PBI in a BMI Matrix Resin".

Primary Examiner—Robert E. Sellers
Attorney, Agent, or Firm—Gary L. Griswold; Walter N. Kirn; Lorraine R. Sherman

[57] ABSTRACT

A woven or nonwoven web, or film (e.g. polyimide) or foil is coated with a homogeneous cured composition comprising a liquid mixture of thermosettable resin(s) such as a polyepoxide and curative(s) such as aromatic polyamines and particles of an amorphous thermoplastic polymer such as a polyetherimide. The particles have an average diameter of from 0.5–50 micrometers, a surface area of at least 1.0 m$^2$/g, a dissolution temperature of at least 50° C., and are insoluble in the thermosettable resin at temperatures of up to 15° C. below the dissolution temperature but are completely dissolved at a temperature of at least 20° C. below the cure temperature of the resin.

12 Claims, 2 Drawing Sheets

ARTICLE COATED WITH KURED HOMOGENEOUS THERMOSET RESIN/THERMOPLASTIC PARTICLES

This is a division of application Ser. No. 08/147,638 filed Nov. 4, 1993, now allowed, which was a divisional of U.S. Ser. No. 07/808,019, filed Dec. 13, 1991, now U.S. Pat. No. 5,276,106, which was continuation-in-part of U.S. Ser. No. 07/596,796, filed Oct. 12, 1990, now U.S. Pat. No. 5,060,564, which was a continuation-in-part of U.S. Ser. No. 07/467,729, filed Jan. 19, 1990, now abandoned.

FIELD OF THE INVENTION

The present invention relates to thermosettable resin compositions and their use together with reinforcing filaments in the production of advanced composites.

BACKGROUND OF THE INVENTION

Thermosettable resins are well known for their use in structural adhesives, in high performance composites, and in prepregs. Composites and prepregs made from these thermosettable resins and high strength fibers such as glass, ceramics, carbon and the like provide articles having considerably less weight than the same article made from metal. The articles, however, made using these thermosettable resins have been brittle, a characteristic that necessarily seriously limits their use. Also, because the viscosity of the thermosettable resins has been either too high during processing or too low during curing many of the articles are rejected because of the development of voids and imperfections in the articles.

Efforts have been made to control the viscosity of the thermosettable resins. Flow control agents, such as fumed silica, clay, whiskers, and high molecular weight polymers, have been added to thermosettable resins. These agents increase the viscosity over all temperature ranges, often making processing difficult or impossible and frequently harm the physical characteristics of the cured article.

High performance thermosetting resins include such resins as epoxies, bismaleimides, and cyanates. These resins react with curing agents or in the presence of polymerization catalysts to yield high performance resins that have gained wide acceptance as protective coatings electrical insulations, structural adhesives, and as a matrix resin together with reinforcing filaments in advanced composites. Where high glass transition temperatures, thermal resistance, and chemical resistance has been attained by the cured resin, the cured resin has generally had poor physical characteristics and been brittle, had poor impact resistance and fracture properties.

There are many references in the art teaching means for improving physical characteristics of cured thermosetting resins, primarily thermosetting epoxy resins, by use of a particular hardener and/or the addition of another polymer and/or an inorganic particulate material.

References among many others that teach means for improving the physical characteristics of cured thermosetting epoxy resin by the addition of a thermoplastic resin include the following:

U.S. Pat. No. 3,784,433 discloses that composites of unidirectional carbon fibers and a thermosettable resin are made by applying the resin as a continuous film to the carbon fibers, applying heat and pressure so that the resin flows about the fibers and forms a coherent structure, and then converting the resin into its solid, fusible B-stage. Heating cycles can be very short as there is no solvent to evaporate, and the thin layers can be cooled quickly.

U.S. Pat. No. 4,524,181 discloses compositions curable to articles having reduced susceptibility to mechanical and thermal shock comprising an epoxy resin and colloidally dispersed elastomeric particles.

U.S. Pat. No. 4,558,078 discloses compositions useful as a prepreg comprising an epoxy prepolymer and curative and optionally a second resin that can be present homogeneously or in the form of an interpenetrating network.

European patent Application 0 274 899 discloses a prepreg consisting of a fiber reinforced resin having as a separate phase fine thermoplastic or thermosetting resin particles distributed throughout the prepreg, preferably the particles are localized in the inter-layer zones of the composite material and remain as a separate phase upon curing the prepreg.

In U.S. Pat. No. 4,157,360 there is disclosed melts of dicyanates and thermoplastic polymers and in U.S. Pat. Nos. 4,745,215 and 4,780,507, there are disclosed blends of dicyanates and thermosetting or thermoplastic polymers. In European Patent Application 0 301 361 there are described rubber-modified cyanate ester resins and polytriazines derived therefrom and in U.S. Pat. No. 4,804,740 there are described curable cyanate ester formulations containing thermoplastics. In U.S. Pat. No. 4,468,497, there is disclosed bis-imides, crosslinking agents, and compatible elastomers; the compositions of these references being useful for making prepregs.

M. T. Blair et al. at the 33rd International SAMPE Symposium of March 7-10, 1988, presented a paper titled "The Toughening Effects of PBI in a BMI Matrix Resin" in which they disclosed the dispersion of 10% polybenzimidazole into a blend of bismaleimide and o,o'-diallylbisphenol A. Such a composition would not exhibit a "dissolution temperature" required in the composition of the instant invention.

SUMMARY OF THE INVENTION

Briefly, the present invention provides a thermosettable resin composition having a viscosity at temperatures used for processing and compounding similar to the viscosity of the unmodified thermosetting resin but having a significant increase in viscosity at higher resin temperatures up to the curing temperature. The thermosettable resin composition comprises a thermosettable resin mixture, which is a liquid at a temperature in the range of 20° to 100° C., comprising:
  a) one or more thermosettable resins and one or more of curatives, hardeners, and catalysts for the thermosettable resin in an amount sufficient for cure of the thermosettable resin, and
  b) 2 to 50, preferably 2 to 30, parts per 100 parts of thermosettable mixture, of resin particles of one or more amorphous thermoplastic polymers having a Tg of 140° C. or higher, the particles having a dissolution temperature (defined hereinafter) of 50° C. or higher, preferably 70° C. or higher, and the particles being essentially insoluble in the thermosettable resin at temperatures up to about 15° C. below the dissolution temperature. The composition may optionally contain additives for property enhancement.

The invention also provides prepregs for structural composites comprising a web of fibrous material impregnated with the thermosettable composition of the invention.

As used in this application:

"dissolution temperature" ("$T_d$") means the temperature at which the viscosity of a composition of thermosettable resin and thermoplastic particles in the absence of curatives, hardeners, or catalyst for the thermosettable resin, when raised at a rate of about 2° C. per minute, reaches a minimum value and then begins to rise as the thermoplastic particles begin to dissolve. This is the temperature at which the thermoplastic particles begin to dissolve; and "temperature of complete dissolution" "$T_{dc}$" represents the temperature at which the thermoplastic particles are completely dissolved in the thermosettable resin when the temperature is raised at a rate of about 2 degrees Centigrade per minute.

Means disclosed in the background art for solving physical shortcomings of the cured thermosetting resin have not solved problems arising in processing of thermosetting resins into useful articles. In processing of a thermosetting resin composition into an article such as a prepreg that can be used in the manufacture of composite structures, the viscosity profile of the thermosetting resin composition is very important. It is important that the viscosity of the composition be relatively low during compounding, coating and impregnating of a fiber reinforcement but becomes relatively high before the final cure temperature during the curing process to allow the application of vacuum to remove volatiles and the application of pressure to shape the composite part without bleeding of excessive amounts of resin that would cause voids and imperfections in the cured composite part.

BRIEF DESCRIPTION OF THE DRAWINGS

Aspects of the invention which are capable of illustration are shown in the accompanying Drawing wherein graphs show the relationship of viscosity to temperature for compositions according to the invention and for state-of-the-art compositions.

In the Drawing, FIG. 1 (details of the formulation and procedures are given in Example 1, below), curve A (comparative) represents the viscosity profile for a conventional thermosetting resin. As can be seen, the viscosity decreases with increasing temperature. Curve B (comparative) is the viscosity profile for a composition of the thermosetting resin of Curve A and 8.5% by weight of polyetherimide thermoplastic. For this trial the thermoplastic has been completely dissolved into the thermoset during mixing to form a completely homogeneous blend. This formulation exhibits a viscosity profile which is well above the unmodified thermosetting resin over all temperature ranges. The formulation of curve C (present invention) is identical to that of curve B, however, in this trial, the polyetherimide thermoplastic is in particle form and is mixed into the thermoset to form a dispersion where none of the thermoplastic is dissolved. The viscosity profile obtained is unique in that, the initial viscosity is essentially the same as that for curve A. However, after the first minimum in viscosity occurs, which is the dissolution temperature ($T_d$), the thermoplastic particles dissolve. This raises the viscosity of the composition up to the level obtained for the homogeneous blend of Curve B.

DETAILED DESCRIPTION OF THE PREFERRED EMBODIMENTS OF THE INVENTION

Figure 1:
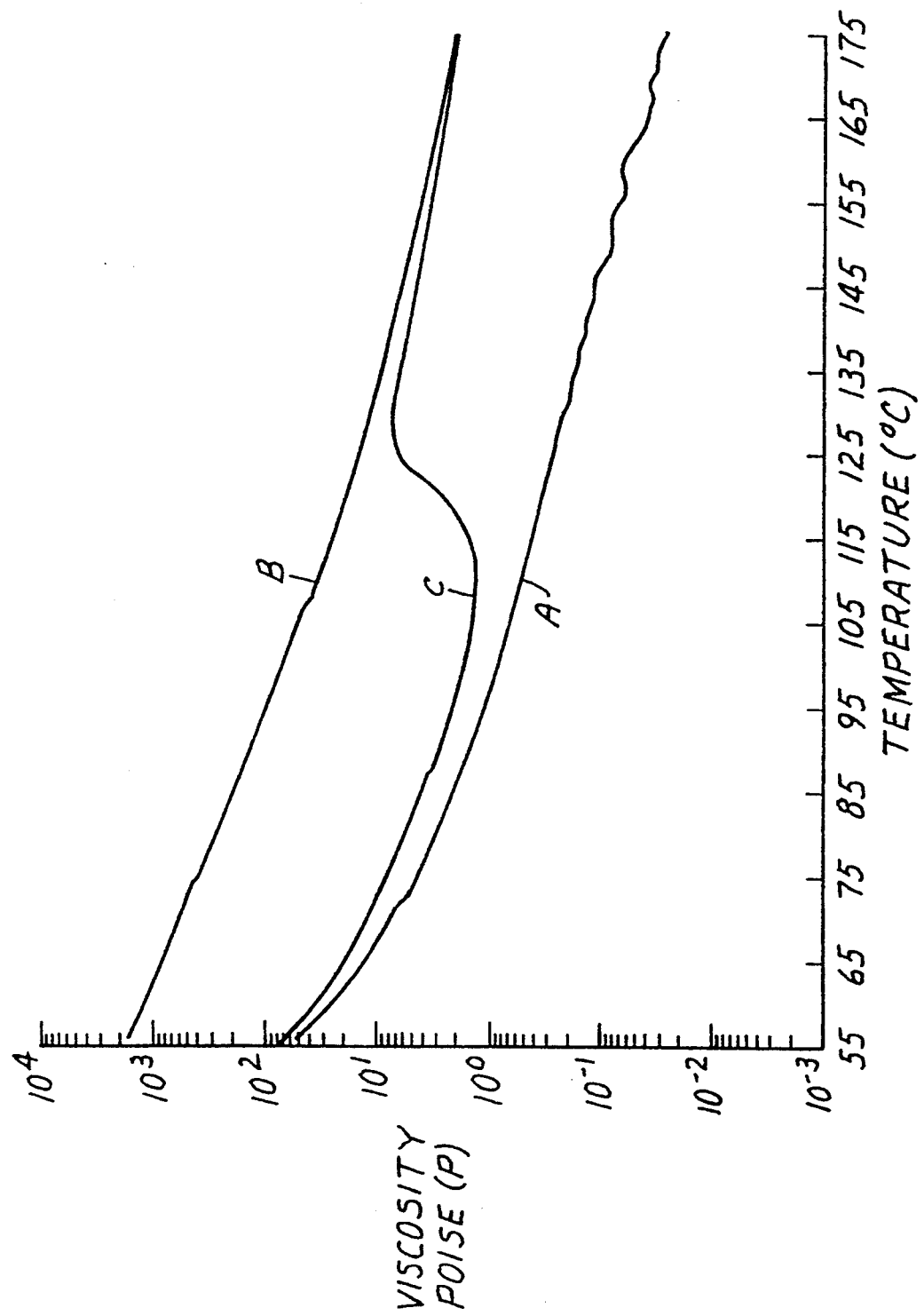
Figure 2:
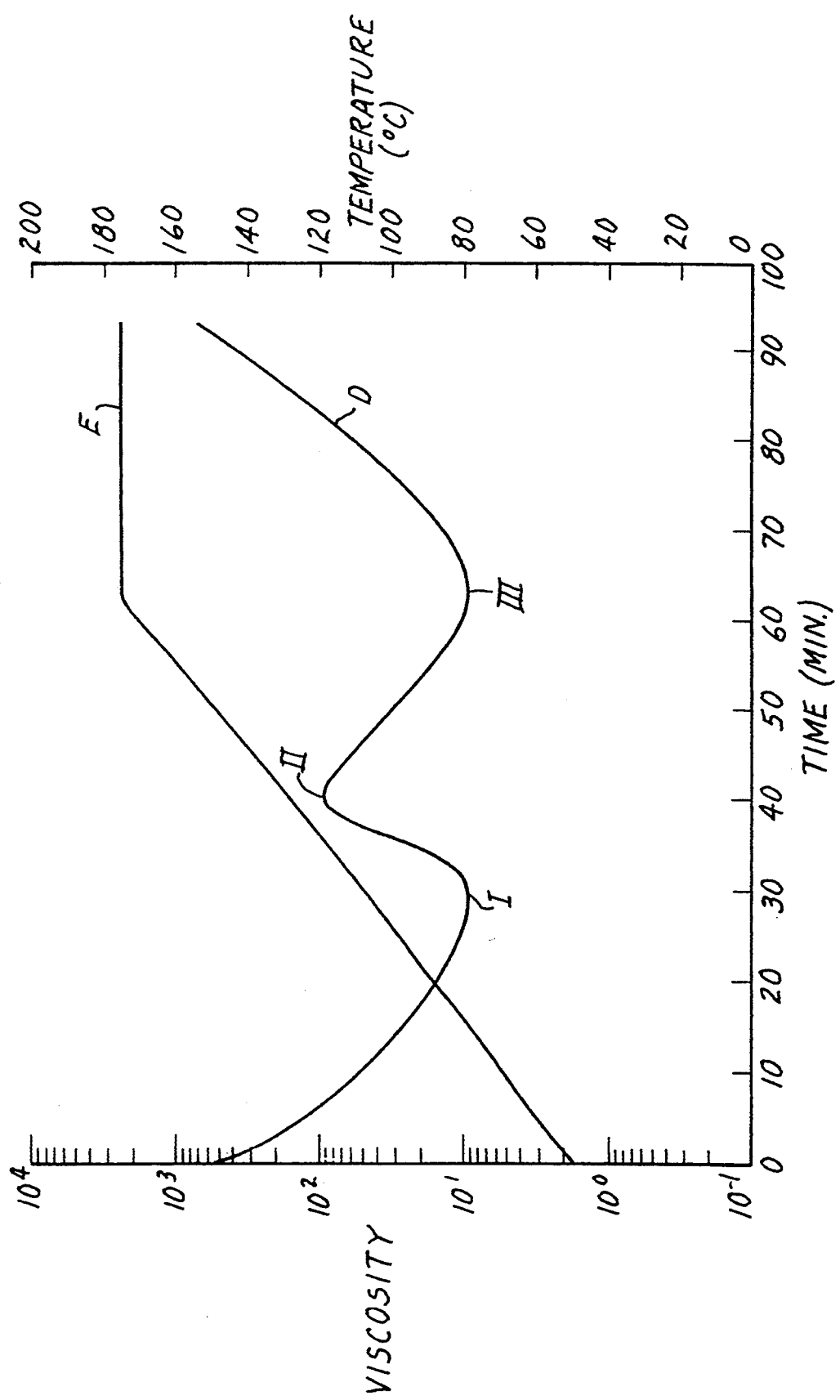
In FIG. 2 of the drawing, curve D shows a viscosity profile for a composition (i.e., Example 3, formulation O), of the invention. Points I, II, and III represented $T_d$ (106° C.) $T_{dc}$ (120° C.) and cure temperature (177° C.), respectively. Curve E shows the temperature profile for the composition of curve D.

Thermosetting resins that can be used as component (a) in the composition of the invention are epoxy, N,N'-bismaleimide, and polycyanate monomers and prepolymers that are liquid at a processing temperature and can be cured to a thermoset resin composition at a temperature of 100° C. or higher.

Epoxy monomers and prepolymers that can be used in the compositions of the invention are well known and most are commercially available. They are compounds in which there is present at least an aromatic or cycloaliphatic ring structure and one or more epoxy groups, e.g.,

compounds having more than one epoxy group are preferred. Aromatic polyepoxides, the most preferred epoxy compounds, are the polyglycidyl ethers of polyhydric phenols, glycidyl esters of aromatic carboxylic acid, and polyglycidyl derivatives of aromatic amines such as N-glycidylaminobenzene, and glycidylaminoglycidyloxybenzenes.

Examples of aromatic polyepoxides, useful in the thermosettable resin composition of the invention, include the polyglycidyl derivatives of polyhydric phenols such as 2,2-bis[4-(2,3-epoxypropoxy)phenyl]propane and those described in U.S. Pat. Nos. 3,018,262 and 3,298,998, incorporated herein by reference and in "Handbook of Epoxy Resins" by Lee and Neville, McGraw-Hill Book Co., New York (1967). A preferred class of poly(glycidyl ether)s of polyhydric phenols of use in the compositions of the invention are the diglycidyl ethers of bisphenols that have pendent carbocyclic groups such as those described in U.S. Pat. No. 3,298,998, which is incorporated herein by reference. Examples of such diglycidyl ethers are 2,2-bis[4-(2,3-epoxypropoxy)phenyl]norcamphane, 9,9-bis[4-(2,3-epoxy-propoxy)phenyl]fluorene, and 2,2-bis[4-(2,3-epoxypropoxy)phenyl]decahydro-1,4,5,8-dimethanonaphthalene. A much preferred diglycidyl ether is diglycidyl ether of bisphenol A.

Examples of N-glycidylaminobenzenes suitable for use in the epoxy resin composition of the invention include the di and polyglycidyl derivatives of benzenamine, benzene diamines, naphthylenamine and naphthylene diamine such as N,N-diglycidylbenzenamine, N,N-diglycidylnaphthalenamine. [given the name of N-1-naphthalenyl-N-(oxiranylmethyl)oxiranemethanamine by Chemical Abstracts 9th Coll. Index, Vol. 76–85, page 2660 CS (1972–76), 1,4-bis(N-glycidylamino)benzene, 1,3-bis(N,N-diglycidylamino)benzene, and bis[4-(diglycidylamino)phenyl]methane (MY 720 ™, Ciba Geigy, Inc.). The polyglycidyl derivatives of aromatic aminophenols are described in U.S. Pat. No. 2,951,825. An example of these compounds is N,N-diglycidyl-4- glycidyloxybenzenamine (ERL 0510 ™, Ciba Geigy, Inc.).

When component (a) of the composition of the invention contains an epoxy monomer or prepolymer it can be cured by a variety of curing agents as are known in the art, some of which are described, together with the method for calculating the amount to be used, in the book by Lee and Neville, "Epoxy Resins," pages 36 to 140 McGraw-Hill Book Company, New York, 1957. Useful curing agents include polyamines such as ethylenediamine, diethylenetriamine, aminoethylethanolamine, and the like, diaminodiphenylsulfone, 9,9-bis(4-aminophenyl)fluorene, 2,7-dichloro-9,9-bis(4-aminophenyl)fluorene, an amide such as dicyanodiamide, polycarboxylic acids such as adipic acid, and acid anhydrides such as phthalic anhydride and chlorendic anhydride, and polyphenols such as bisphenol A, and the like. The curing agent is chosen such that very little if any polymerization of the epoxy takes place under about 100° C. but does take place with increasing rapidity as the temperature is increased above about 125° C. Generally, the epoxy composition and curing agent are used in stoichiometric amounts. However, the curing agent can be used in amounts ranging from about 0.1 to 1.5 times the stoichiometric amount of epoxy resin.

Thermally activated catalytic agents may also be used, e.g., Lewis acids and bases, tertiary amines, imidazoles, complexed Lewis acids, and organometallic compounds and salts, such as the $BF_3$-amine complexes, $SbF_5$, and benzyldimethylamine. When a thermally activated catalyst is included, about 0.01 to 5 percent by weight of catalyst, based on the amount of epoxy compound present in the thermosettable resin composition, is used.

N,N'-bismaleimide monomers and prepolymers that can be used in the composition of the invention are also well known, many of Which can be purchased commercially. They are compounds in which there is present at least one, preferably two, maleimido groups and have general formula I:

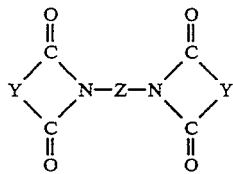

where Y represents an alkylene group of at least 2 carbon atoms, preferably 2 to 6 carbon atoms, and Z is a divalent organic group containing at least 2 carbon atoms and generally no more than 20 carbon atoms. Z may be aliphatic, cycloaliphatic, aromatic or heterocyclic, these groups optionally having up to two of each of sulfur and non-peroxidic oxygen heteroatoms. Y may be derived from dicarboxylic acids or anhydrides such as maleic, citraconic, tetrahydrophthalic, and the like.

Representative N,N'-bis-imides that may be employed are the N,N'bismaleimides of 1,2-ethanediamine, 1,6-hexanediamine, trimethyl-1,6-hexanediamine, 1,4-benzenediamine, 4,4'-methylenebisbenzenamine, 2-methyl-1,4-benzenediamine, 3,3'-methylenebisbenzenamine, 3,3'sulfonylbisbenzenamine, 4,4'-sulfonylbisbenzenamine, 3,3'oxybisbenzenamine, 4,4'oxybisbenzenamine, 4,4'-methylenebiscyclohexanamine, 1,3-benzenedimethanamine, 1,4-benzenedimethanamine, and 4,4'-cyclohexanebisbenzenamine and mixtures thereof. Other N,N'bis-maleimides and their process of preparation are disclosed in U.S. Pat. Nos. 3,562,223, 3,627,780 and 3,839,358, the disclosures of which are incorporated herein by reference.

The preparation of the N,N'-bismaleimides is well known and described in U.S. Pat. No. 4,468,497 which is incorporated herein by reference for that purpose.

The N,N'-bismaleimides are polymerized by heating them together with a diamine into which they can be dissolved at temperatures of 100° C. or lower and optionally a diunsaturated crosslinking agent.

Diamines that can be used in polymerizing the N,N'-bismaleimides are described in U.S. Pat. No. 3,562,223, which is incorporated herein by reference for that purpose. Preferred diamines which may be employed are diamines having a cycloalkyl or aryl group, and are the same as those listed above, that ate of use in the preparation of the N,N'-bismaleimides.

Generally, from about 0.2 to 0.8 moles of diamine are used per mole of N,N'-bismaleimide.

Diunsaturated cross-linking agents of use in the N,N'-bismaleimide compositions of the invention are any diunsaturated compounds having a boiling point at atmospheric pressure of about 150° C. or higher and terminal ethylenic unsaturation. Preferred cross-linking agents are divinylbenzene, diallyl phthalate, and bis(4-allyloxyphenyl)ether.

Dicyanate monomers and prepolymers that can be used in the composition of the invention are also well known. References to their preparation and use in polycyclotrimerization to produce polycyanurates are described in U.S. Pat. No. 4,157,360 which is incorporated herein by reference. The dicyanates are compounds having general formula II:

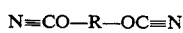

$$N{\equiv}CO{-}R{-}OC{\equiv}N \quad \text{II}$$

wherein R is a divalent aromatic hydrocarbon residue and comprises at least one aromatic moiety, i.e., aromatic ring including benzene, naphthalene, anthracene, phenanthrene and the like, and where R contains a total of up to 40 carbon atoms, including the aromatic moiety. For example, R can be 1,4-di(2'-phenylpropyl)benzene moiety, to which the cyanate groups are attached in the para positions of the benzene rings of the phenylpropane substitutents to provide one embodiment of compounds of formula II. The aromatic rings of R may be further substituted with groups that are inert during the polymerization process, i.e., the polycyclotrimerization process, and include halogen, including fluorine, chlorine, bromine, and iodine; $C_1$–$C_4$ alkoxy, being linear or branched and including methoxy, ethoxy, isopropoxy, and t-butoxy; and $C_1$–$C_4$ alkyl carbonyloxy group, being linear or branched, including methoxycarbonyl, ethoxycarbonyl, isopropoxycarbonyl and t-butoxycarbonyl; wherein the number of substitutents on the aromatic rings may be one or more with the proviso that the groups are inert during the polymerization process and do not substantially interfere with the formation of the crosslinked triazine polymer upon polycyclotritrimerizing of the aromatic dicyanate moiety.

By the term "polycyclotrimerization" is meant forming a cyanurate ring system by the polymeric condensation of three aromatic cyanate groups to form a crosslinked aromatic ring system, which has as its basic repeating unit the group of formula III:

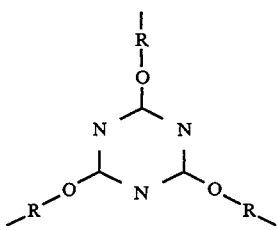

III in which R substituents, independently as defined above, are attached to oxygen atoms. Methods for conducting the polymerization are well known, including thermal annealing above about 200° C. and are described in the Korshak reference discussed in U.S. Pat. No. 4,157,360, cited above.

Preferred dicyanates are those in which R in Formula III can have any of the structural formulae:

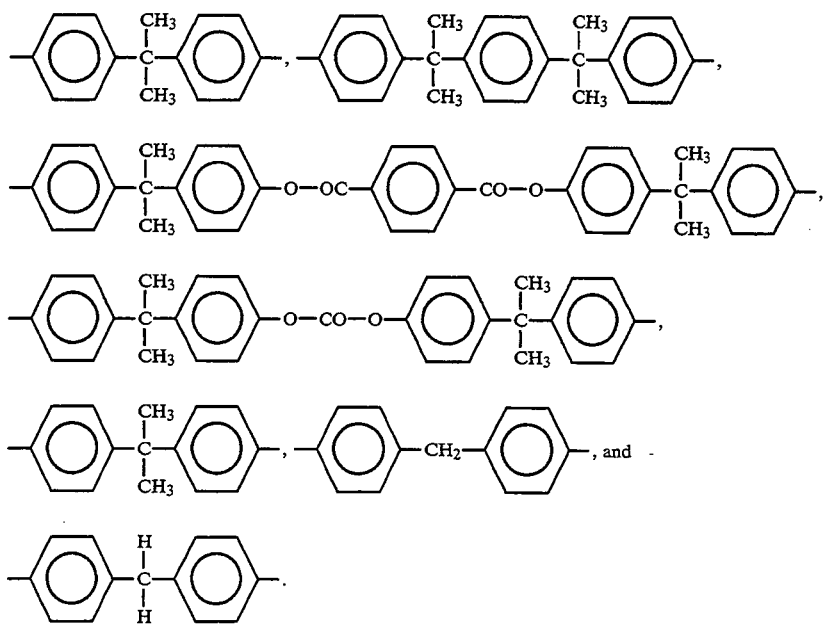

or combinations thereof.

When polycyanates are used in component (a) of the composition of the invention, mixtures of any proportions of polycyanates and prepolymers of the polycyanates and optionally monocyanates that are liquid at the processing temperature which preferably is in the range of 20° to 100° C. can be used. Prepolymers are made by heating the blends with or without catalyst at a temperature of about 140° C. to about 220° C. for a time sufficient to cyclotrimerize from about 5 to about 50 percent of the cyanate functional groups.

Catalysts that can be used in cyclotrimerizing the polycyanates to form prepolymers and completely polymerized polycyanurates include zinc octoate, tin octoate, zinc stearate, tin stearate, copper acetylacetonate, phenol, catechol, triethylendiamine and chelates of iron, cobalt, zinc, copper, manganese and titanium with bidentate liquids such as catechol. Such catalysts are used in the amounts of about 0.001 to about 20 parts by weight per 100 parts of the polycyanate ester blend. Other catalysts and their use in curing polycyanates are disclosed in Great Britain Patent No. 1,305,762 incorporated herein by reference. It is, however, possible to conduct the formation of prepolymers and the complete polymerization without a catalyst, utilizing only heat.

Cyanate esters that can be used include RDX 80352 TM a prepolymer of bisphenol A dicyanate, by Interez, Inc; XU71787 TM a polycyanate of a polyphenol adduct of dicyclopentadiene by Dow Chemical Company; and BT 2160 TM resin, a prepolymer of bisphenol A dicyanate containing 10% by weight of 4,4'-methylenedianiline bismaleimide, commercially available from Mitsubishi Gas Chemical Company.

Resin particles which can be used as component (b) in the thermosettable resin composition of the invention have a dissolution temperature above about 50° C., preferably above about 70° C., and are insoluble in the thermosettable resin at temperatures up to about 15° C. below the dissolution temperature but soluble at a temperature below the onset of curing which varies depending on the resin but generally is in the range of 100° to 200° C.

The resin particles are prepared from amorphous thermoplastic resins having a glass transition temperature above about 140° C. Resin particles having the required solubility characteristics have a solubility in the thermosettable resin that is low enough to prevent the particles from dissolving when the particles are mixed into the thermosettable resin or during storage of the thermosettable mixture. The resin particles, however, also have a solubility sufficient to allow the particles to be completely dissolved in the thermosettable resin during the cure cycle of the composition. The resin particles dissolve at a temperature below the cure temperature by at least 20° C., preferably by at least 24° C., to form a homogeneous solution.

Thermoplastic resins suitable for preparation of the resin particles of the invention are amorphous thermoplastics including polycarbonates, polysulfones, polyarylates, polyethersulfones, polyarylsulfones, polyesters, polyetherimides, polyamideimides, polyimides, polyamides, and polyethers. Preferred thermoplastic resins are polyetherimides such as ULTEM TM 1000, available from General Electric polyethersulfone, such as Victrex ™ 4800P, available from ICI, and polyarylsulfone, such as Radel ™ A-200 available from Amoco. The suitability of a particular thermoplastic resin is dependent on meeting the above solubility characteristics in the specific thermosettable resin being used in the thermosettable resin composition.

The resin particles having the desired solubility characteristics can be prepared by a variety of well know techniques, including techniques such as grinding of the solid amorphous thermoplastic resin, spray drying of solutions of the amorphous thermoplastic resin, or coagulation of emulsions of the amorphous thermoplastic resin. Suitable particles preferably have a surface area of at least 0.5 square meter per gram and most preferably a surface area of 1.0 $m^2/g$ or greater. Particle sizes generally are in the range of 0.5 to 50 micrometers, preferably 0.5 to 40 micrometers. More preferably fully densified particles are in the range of 0.5 to 10 micrometers and porous particles are in the range of 0.5 to 40 micrometers.

The surface area of the amorphous resin particle is important. The surface area of the particle controls the dissolution rate of the thermoplastic particle into the thermosetting resin to form a homogeneous solution. If the surface area is too low the dissolution rate is slow and can result in the thermosetting resin curing before the particle can dissolve. If the particle does not dissolve prior to curing the desirable enhanced viscosity will not be imparted. The high surface area of particles useful in the present invention enables the particles to fully dissolve, forming a homogeneous solution in the resin mixture prior to cure, and preferably providing a homogeneous cured network.

Particles having high surface area can be prepared in several ways. A small particle has a high surface area. These particles can be prepared by grinding or coagulation of a polymer dispersion. Another method of obtaining a high surface area is to prepare porous particles. Porous particles can be obtained by spray drying solutions of amorphous thermoplastics, as is known in the art.

The solubility characteristics of a particular resin particle can be adjusted, i.e., the dissolution temperature lowered, by the incorporation of a plasticizer, i.e., from about 5 to 50 percent by weight, into the thermoplastic resin from which the resin particle is prepared. Preferably, the plasticizer has a functional group that will copolymerize with the thermosettable resin, i.e. a reactive plasticizer. As examples, an epoxy resin, for example the diglycidyl ether of bisphenol A, can be used to plasticize a particle to lower its dissolution temperature, i.e., increase its rate of dissolution into an epoxy resin or a cyanate resin composition. For example, an amine can be used to plasticize a particle to increase its rate of dissolution into N,N′-bismaleimide monomers and prepolymers.

By the phrase "essentially insoluble" it is meant that generally less than about 25% of the particles dissolve when the composition is held at a temperature of 15° C. less than the dissolution temperature for at least two hours, such that the viscosity of a composition of the thermoplastic particles in the thermosettable resin does not change significantly, i.e., to a point making processability difficult.

The thermosettable compositions of the invention are suitable for use as impregnating, laminating or molding resins. They can be used as sealants, insulating materials and adhesives. They are particularly suitable for use in prepregs for the production of space age reinforced composite structures.

The thermosettable resin composition of the invention can be used to impregnate woven or non-woven webs, filaments, rovings or the like at a temperature below the dissolution temperature in the preparation of prepregs. Fibers that can be used in such prepregs include organic and inorganic fibers including, for example, glass fibers, carbon or graphite fibers, ceramic fibers, boron fibers, silicon carbide fibers, polyimide fibers and the like, and mixtures thereof. The thermosettable composition of the invention can also be used to coat woven and non-woven webs, films and foils of organic and inorganic materials including, for example, such organic materials as polyolefins, polyesters, polyimide, and the like and inorganic materials such as ceramics, copper, and nickel, and gold. These materials can be useful in printed circuit technology and as structural components for machinery.

The composition of the invention can also contain additives to modify characteristics of the cured composition. Additives among others that can be used include: inert fillers, tougheners, whiskers, pigments, dyes and flame retardants such as, for example, chopped fibers such as ceramic fibers, glass fibers, boron fibers, carbon fibers, and their woven and nonwoven fabrics; inorganic powders such as kaolin, chalk, silica, antimony trioxide, titanium oxide, carbon; and solid microspheres of glass, ceramic, and metal.

The thermosettable compositions of the invention are prepared by dispersion of the thermoplastic particles, curatives, hardeners, catalysts, and modifying additives into the thermosettable resin at a temperature at which the thermosettable resin is liquid, generally at about 30° to 60° C. but below the dissolution temperature of the particle in the thermosettable resin. The dispersion of the particles into the thermosettable resin is generally accomplished by conventional high shear mixing devices, such as by use of a planetary mixer, kneader, vacuum mixer, ball mill, paint mill or high speed stirrer. When the mixed composition is then maintained at a temperature of 15° C. or more below the dissolution temperature, the composition is stable against gelling for two hours or longer.

More particularly, in a preferred embodiment, the invention provides a process for preparing a thermosettable composition comprising the steps of:

dispersing thermoplastic particles having a surface area of at least 1.0 $m^2/g$ into a thermosettable resin at a temperature at least 15° C. below the dissolution temperature of the particles in the thermosettable resin, increasing the temperature at a rate sufficient to effect complete dissolution of the particles and provide a homogeneous solution of the particles in the thermosettable resin, the temperature of complete dissolution of the particles being at least 20° C. below the cure temperature of the resin, continuing to increase the temperature so as to effect cure of the homogenous solution to provide a cured thermosettable composition, which preferably is a homogeneous cured thermosettable composition.

While these thermosettable compositions of the invention are generally processed by hot melt coating techniques, organic solvents such as methyl ethyl ketone, toluene, tetrahydrofuran, ethyl acetate, ethyl alcohol, etc., can also be used to process these resin compositions. For example, solvent processing may be desirable to prepare a thin adhesive film from these thermosettable compositions. When solvents are used care must be used to select a solvent that will dissolve the liquid thermosetting resin but will not dissolve the thermoplastic particle. Suitable substrates for coating the compositions of the invention include sheets and foils of polyimide, polyester, polyolefin, metal, and the like, and fibers such as carbon, glass, aramide, ceramic, and the like.

The invention also provides a process for preparing an uncured prepreg comprising the steps of:
providing at least one layer of a composition comprising dispersed thermoplastic particles having. a surface area of at least 1.0 $m^2/g$ in a thermosettable resin at a temperature at least 15° C. below the dissolution temperature of the particles in the thermosettable resin,
laminating said at least one layer to reinforcing fibers at a temperature at least 15° C. below the dissolution temperature of the particles to form a prepreg,
heating said prepreg at a rate sufficient to effect complete dissolution of the particles in the resin and provide a homogeneous solution of the particles in the thermosettable resin, the temperature of complete dissolution of the particles being at least 20° C. below the cure temperature of the resin to form a composite article, and continuing to heat the composite article so as to form a cured composite article.

Objects and advantages of this invention are further illustrated by the following examples, but the particular materials and amounts thereof recited in these examples, as well as other conditions and details, should not be construed to unduly limit this invention. In the examples all parts and percentages are by weight and temperatures are in degrees centigrade unless otherwise noted.

In the examples which follow, the viscosity profiles were obtained using an RDA-700 TM Dynamic Mechanical Analyzer (Rheometrics, Inc.). The instrument was used in the parallel-plate mode under the following conditions: gap=1 mm, radius=19.02 mm, frequency=100 rad/sec, strain=20%, temperature ramp at 2° C./min, initial temperature=50° C., and final temperature=177° C., which was the cure temperature.

EXAMPLE 1

A thermosettable resin composition was prepared by mixing 35 parts of 9,9-bis[4-(2,3-epoxypropoxy)phenyl]-fluorene (DGF) and 65 parts of diglycidyl ether of bisphenol A (DGEBA). The resin composition was then used in three formulations: into Formulation A, no additional material was added; into Formulation C, 8.5% by weight of a particulate PEI (ULTEM resin, a polyetherimide resin. available from General Electric) having a particle size of 3.2 microns and a surface area of about 5.4 $m^2/g$ was dispersed into the resin composition at 60° C. using an air stirrer; Formulation B was the same as Formulation C, however the mixture was heated to 120° C. and stirred to allow the thermoplastic ULTEM to completely dissolve into the resin composition. The viscosity profile of each formulation was determined using the RDA-700 Dynamic Mechanical Analyzer described above and plotted in FIG. 1. Curve A, for unmodified resin composition shows a steady decrease in viscosity as the temperature of the composition is increased. Curve C, for the resin composition modified with particulate thermoplastic,. shows about the same decrease in viscosity of the mixture as for the unmodified resin composition as the temperature is increased up to the dissolution temperature, $T_d$, Where the thermoplastic begins to dissolve. At this temperature the viscosity increase, due to the dissolving thermoplastic particles, offsets the viscosity decrease of the resin composition alone and prevents further decrease in the viscosity of the mixture. Curve B, for the resin composition modified with dissolved thermoplastic shows an initial viscosity much higher than the viscosity of the composition modified with particulate thermoplastic. Formulation C thus provides the low viscosities desirable at the initial temperatures of a processing operation, e.g., prepreg fabrication, and the higher viscosities (i.e., controlled flow) that are advantageous at cure temperatures to insure void-free cured composites.

EXAMPLE 2

Thermosettable resin compositions were prepared as shown in Table I.

TABLE I

| Formulation | Composition | | $T_d$ °C. | $T_{dc}$ °C. | Minimum Viscosity (poise) |
| | Thermosettable Resin | % Thermoplastic particle[d] | | | |
| --- | --- | --- | --- | --- | --- |
| D | (a) | None | (e) | | 0.36 |
| E | (a) | 8.5 | 115 | 137° C. | 4.78 |
| F | (b) | None | (e) | | 0.15 |
| G | (b) | 8.5 | 119 | 135° C. | 2.55 |
| H | (c) | None | (e) | | 1.20 |
| I | (c) | 8.5 | 115 | 124° C. | 10.60 |

(a) Thermosettable resin is 100 parts of 4,4'-tetraglycidyldiaminodiphenylmethane (TGDDM) and 31 parts of 4,4'-diaminodiphenylsulfone (DDS) mixed at 120° C. with an air stirrer to completely dissolve the DDS.
(b) Thermosettable resin is AroCy B-30 TM, a dicyanate available from Hi-Tek Polymers, Inc.
(c) Thermosettable resin is Compimide TM, a bismaleimide resin available from Shell Chemical Co.
(d) PEI thermoplastic particle (disclosed in Example No. 1).
(e) Thermosettable resin without the thermoplastic particle does not reveal a dissolution temperature, $T_d$.

Viscosity profiles of each formulation was determined using the RDA-700 Dynamic Mechanical Analyzer and the dissolution temperature, $T_d$, and minimum viscosity of each recorded Table I. Each of the thermosettable resins, an epoxy, a dicyanate, and a bismaleimide show minimum viscosities of 0.36, 0.15, and 1.20 poise, respectively while these thermosettable resins to which 8.5% by weight of thermoplastic particulate resin have been added show a dissolution temperature of 115°, 119°, and 115°, respectively, and a corresponding minimum viscosity of 4.78, 2.55, and 10.60 poise, respectively.

EXAMPLE 3

Thermosettable compositions of a fluorene epoxy resin PR-500 (3M), with various thermoplastic resins were prepared by mixing 4.65 parts of each thermoplastic resin shown in Table II with 50 parts of PR-500 at 60° C. using an air stirrer. The viscosity profile of each mixture as well as that of the composition without added particulate thermoplastic was obtained and minimum viscosity and dissolution temperature of each recorded in Table II.

TABLE II

| | Composition | | | | |
|---|---|---|---|---|---|
| Formulation | Thermosettable Resin | Thermosettable particle (Tg)[l] | $T_d$ °C. | $T_{dc}$ °C. | Minimum Viscosity (poise) |
| J | PR-500[f] | None | (e) | | 0.30 |
| K | PR-500[f] | PES[q] (230) | 119 | 137° C. | 1.61 |
| L | PR-500[f] | PC[h] (154) | 74 | 92 | 2.34 |
| M | PR-500[f] | PS[i] (190) | 86 | 108 | 6.50 |
| N | PR-500[f] | PAS[j] (220) | 106 | 123 | 3.76 |
| O* | PR-500[f] | PEI[k] (217) | 106 | 128 | 9.30 |
| P | PR-500[f] | 50 PAS/50 PEI | 106 | 125 | 4.15 |
| Q | PR-500[f] | FPE[m] (330) | 105 | 133 | 2.80 |

*Graph D represents viscosity profile data of Formulation O. Data points represent viscosity of the composition as temperature was raised 2° C. every 1 minute.
(e) no dissolution temperature observed
(f) an aromatic epoxy resin available from 3M
(g) Victrex 4800 ™, a polyethersulfone available from ICI Americas, Inc.
(h) Lexan ™, a polycarbonate available from General Electric Co.
(i) Udel ™ P1700, a polysulfone available from Amoco Performance Products, Inc.
(j) Radel ™ A-200, a polyarylsulfone available from Amoco Performance Products, Inc.
(k) Ultem ™ 1000, a polyetherimide available from General Electric Company
(l) The glass transition temperature of the thermoplastic resin
(m) A polyester resin prepared from a fluorene bisphenol and isophthalic/terephthalic acid (a 50/50 mole ratio)

The data of Table II show that on heating an unmodified epoxy resin, Formula J, that the viscosity dropped to a minimum of 0.30 poise while for epoxy resin modified by a variety of thermoplastic particles that were soluble at a dissolution temperature, $T_d$, and essentially insoluble be this temperature, the viscosity of the composition does not drop below a much higher value depending on the particul thermoplastic.

EXAMPLE 4

Portions of Formulation J and Formulation O of Example 3 were degassed and cured in molds at 177° C. for four hours. Fracture toughness, $K_{IC}$ (critical plane-strain fracture toughness in Mode I), and Tensile Modulus for e cured sample were determined following the procedures of ASTM E399-83 and ASTM D638-86, respectively. Values obtained are recorded in Table II.

TABLE III

| | Composition | | | |
|---|---|---|---|---|
| Formulation | Thermosettable Resin | Thermoplastic Particle | $K_{IC}$ MPa-m$^{\frac{1}{2}}$ | Tensile Modulus GPa |
| J | PR-500 | None | 0.644 | 3.52 |
| O | PR-500 | 8.5% PEI | 0.909 | 3.42 |

As the data of Table III illustrates, the addition of thermoplastic particles, PEI, that began to dissolve at a dissolution temperature but were essentially insoluble below this temperature, provided an increase of about 44% in the fracture toughness of cured resin with essentially no loss in the tensile modulus.

EXAMPLE 5

A formulation of PR-500 epoxy resin and 8.5% by weight of PEI particles was examined in an RDA-700 Dynamic Mechanical Analyzer as described above with the exception that the temperature was elevated at 2° C. per minute until the temperature of the formulation reached 70° whereon the temperature was held at 70° C. for a two hour dwell. The viscosity of the formulation remained unchanged during this dwell time. Upon raising the temperature, the characteristic $T_d$ was seen and the viscosity of the formulation increased.

EXAMPLE 6

Illustrating control of dissolution temperature by control of the surface area of the thermoplastic particle.

Particles of PEI were prepared to have surface areas, as shown in Table IV, of about 1.0 to 9.0 square meters per gram as determined by BET ((Brunauer, Emmett, and Teller), surface areas obtained on a Quantasorb BET ™ Surface Analyzer (manufactured by Quantachrome, Co.)) surface analysis. Compositions of each were prepared by mixing 4.65 parts of the particles in 50 parts of PR-500 epoxy resin at 60° C. as described in Example 3 and their viscosity profiles were determined by RDA-700. The dissolution temperature, $T_d$, of each composition is given in Table IV.

TABLE IV

| Composition | Surface Area (m²/g) | Dissolution Temp. (°C.) | $T_{dc}$ °C. |
|---|---|---|---|
| R | 1.01 | 127 | 153 |
| S | 2.65 | 114 | 138 |
| T | 2.73 | 108 | 131 |
| U | 3.60 | 107 | 133 |
| V | 4.73 | 95 | 112 |
| W | 8.98 | 92 | 115 |

From Table IV, it is to be observed that for the thermoplastic polyetherimide, PEI, that by control of the surface area from about 1.0 to 9.0, the dissolution temperature of the composition was controlled from 127° to 92° C.

EXAMPLE 7

Comparative

The viscosity profile of a 10.0 weight % composition of the particulate thermoplastic polyimide, Durimid ™ (available from Rogers Corporation) in PR-500 epoxy resin was obtained by RDA-700. No dissolution temperature was observed; the composition therefore, illustrated a thermosettable composition not included in the invention.

EXAMPLE 8

Comparative

A thermosettable composition of 50 parts of PR-500 epoxy resin and 5.56 parts of conventionally ground polyetherimide thermoplastic resin, having a surface area of 0.3 m$^2$/g, was prepared as described above and its viscosity profile obtained. No dissolution temperature was observed, the viscosity continued to drop with increasing temperature up to onset of polymerization of the epoxy resin. Prepregs prepared of this composition possessed voids and discontinuities similar to that of epoxy resin without the modifying thermoplastic.

EXAMPLE 9

Three thermosettable compositions, X, Y, and Z of PR-500 epoxy resin and polyetherimide (PEI) particles having a surface area of 4.73 m$^2$/g were prepared by mixing the components at 60° C. using an air stirrer. Compositions X, Y, and Z contained 2.63 parts (5.0%), 4.65 parts (8.5%), and 5.56 parts (10.0%) of PEI, respectively, in 50 parts of PR-500 epoxy resin. Viscosity profile of each composition was obtained and the minimum viscosity observed to be 3.5 poise, 10.35 poise, and 21.22 poise respectively. This illustrated the control of viscosity that was important during the early stages of a processing operation, e.g., prepreg fabrication, that was obtained using compositions of the invention.

| | |
|---|---|
| $T_d$ for 5% PEI | 95° C. |
| $T_{dc}$ for 5% PEI | 113° C. |
| $T_d$ for 8-½% PEI | 95° C. |
| $T_{dc}$ for 8-½% PEI | 112° C. |
| $T_d$ for 10% PEI | 96° C. |
| $T_{dc}$ for 10% PEI | 114 |

EXAMPLE 10

A thermosettable resin composition was prepared by mixing 91.5 parts of PR-500 epoxy resin and 8.5 parts of particulate polyetherimide having a surface area of 5.37 m$^2$/g. The mixing was performed in a planetary mixer at 35° C. under vacuum. The resin composition was further processed into a resin film approximately 66 micrometers thick. The film was laminated with continuous carbon fibers (IM7 ™ fibers Hercules Co.) using a conventional 30 cm wide prepregging machine (available from California Graphite Machines, Inc.). Sixteen plies of prepreg made by this process were layed-up and cured by a conventional autoclave cycle, to form a void free composite panel having a glass transition temperature of 205° C., useful as a structural component in a machine.

When the procedure of Example 10 was repeated using prepreg that had not been modified with particulate thermoplastic resin, the panel obtained had many voids due to excessive resin flow.

EXAMPLE 11

Illustrating the control of the dissolution temperature by plasticizing the thermoplastic particle Plasticized polyetherimide thermoplastic particles (PEI/DGF) were prepared by dissolving 90 parts PEI and 10 parts by weight of bis[4-(2,3-epoxypropoxy)-phenyl]fluorene in 300 parts of dichloromethane, emulsifying in water and coagulating by pouring into methanol. Particles having an average diameter of 3 micrometers and a surface area of 5.40 m$^2$/g were obtained. Into 50 g of PR-500 epoxy resin at 60° C. were dispersed 4.65 g of these particles and the viscosity profile of the mixture was obtained. A dissolution temperature of 95° C. as compared to 106° C. for the unplasticized polyetherimide particles (Example 3) was obtained.

| | Plasticized |
|---|---|
| $T_d$ | 95° C. |
| $T_{dc}$ | 117° C. |
| | Unplasticized |
| $T_d$ | 106° C. |
| $T_{dc}$ | 128° C. |

The data show that the addition of a plasticizer for the thermoplastic particles reduces the dissolution temperature of the particles in a thermosettable resin.

EXAMPLE 12

Formulations AA, BB, and CC were prepared, each to contain 50 parts of epoxy resin mixture of 35% bis[4-(2,3-epoxypropoxy)phenyl]fluorene (DGF) and 65% of diglycidyl ether of bisphenol A (DGEBA) and 4.65 parts, respectively, of polysulfone (PS), PEI/DGF (the epoxy plasticized polyetherimide described in Example 11), and polyetherimide PEI (the polyetherimide as used in Example 3) by mixing at 60° C. using an air stirrer. An RDA-700 viscosity profile of each was obtained, each including a dwell period at a temperature about 15° C. below the dissolution temperature. Table V shows the dissolution temperature, the dwell temperature, and the viscosity at the beginning and end of the two hour dwell time.

TABLE V

| Formulation | $T_d$ (°C.) | Temp. (°C.) of Dwell | Viscosity (poise) Initial | Final |
|---|---|---|---|---|
| AA | 86 | 70 | 10.8 | 11.0 |
| BB | 95 | 80 | 4.3 | 4.5 |
| CC | 106 | 90 | 2.8 | 2.8 |

The data of Table V show that for compositions of the invention of a thermosettable resin and particles of thermoplastic having a dissolution temperature of 86°, 95°, and 106° C. respectively, can be held at a temperature about 15° C. below the dissolution temperature for at least two hours without an appreciable change in the viscosity of the composition.

EXAMPLE 13

(Comparative)

A thermosettable composition of PR-500, an aromatic epoxy resin available from 3M, and 8.5% by weight of polybenzimidazole (PBI) particle was prepared by mixing 4.65 parts of Ultrafine PBI (Celanese Corporation) having a surface area of 12.3 m$^2$/g with 50 parts of PR-500 at 60° C. using an air stirrer. The viscosity profile for this composition showed no evidence of dissolution of PBI. The profile is essentially the same as that obtained for an unmodified PR-500 composition.

Various modifications and alterations of this invention will become apparent to those skilled in the art without departing from the scope of the invention.

We claim:

1. An article comprising a woven or nonwoven web, film, or foil coated with a hot melt coatable thermosettable resin composition comprising:
   a) a thermosettable mixture that is liquid at a temperature in the range of 20° to 100° C. comprising one or more thermosettable resins and one or more curatives for the thermosettable resins and
   b) resin particles of one or more amorphous thermoplastic polymers, said particles being dispersed in the thermosettable mixture at a temperature below the dissolution temperature of the particles, the particles having an average diameter in the range of 0.5 to 50 micrometers, a surface area of at least 1.0 $m^2/g$, and a dissolution temperature of 50° C., or higher and being essentially insoluble in the thermosettable resin at temperatures up to 15° C. below the dissolution temperature;

said resin composition being free of solvent for the thermoplastic particles and having a viscosity that decreases with increasing temperature up to a dissolution temperature and that increases with increasing temperatures at temperatures above the dissolution temperature, said amorphous particles being completely dissolved in the thermosettable resin at a temperature at least 20° C. below the cure temperature of the resin, and providing a homogeneous cured resin composition.

2. The article according to claim 1 wherein said resin composition further comprises a diunsaturated crosslinking agent.

3. The article according to claim 1 wherein said resin particles of said resin composition further comprise an amount of a plasticizer sufficient to lower the dissolution temperature of the particles.

4. The article according to claim 3 wherein said plasticizer is an epoxy, amine, or cyanate compound.

5. The article according to claim 4 wherein said plasticizer is present in an amount of 5 to 50 parts per 100 parts of said resin particles.

6. The article according to claim 1 wherein said resin composition further comprises at least one of fillers, tougheners, pigments, dyes, and flame retardants.

7. The article according to claim 6 wherein said filler is selected from the group consisting of fibers, whiskers, powders, and solid microspheres.

8. The article according to claim 1 wherein said woven or nonwoven web is selected from the group consisting of organic and inorganic fibers.

9. The article according to claim 8 wherein said inorganic fibers are selected from the group consisting of glass fibers, carbon or graphite fibers, ceramic fibers, silicon carbide fibers, said organic fibers are selected from the group consisting of and polyaramide fibers.

10. The article according to claim 1 wherein said film is a polyimide film.

11. The article according to claim 1 wherein said resin particles in said resin composition are polyetherimide.

12. The article according to claim 1 wherein said thermosettable resin mixture comprises 4,4'-tetraglycidyldiaminodiphenylmethane and 4,4'-diaminodiphenylsulfone, and said resin particles are polyetherimide particles.

* * * * *

UNITED STATES PATENT AND TRADEMARK OFFICE
CERTIFICATE OF CORRECTION

PATENT NO. : 5,405,686
DATED : April 11, 1995
INVENTOR(S) : Gene B. Portelli et al.

It is certified that error appears in the above-indentified patent and that said Letters Patent is hereby corrected as shown below:

```
On the title page, item [54] and column 1, line 2, "Kured" should
read --Cured--.
```

Col. 1, line 48, there should be a comma after "coatings".

Col. 4, line 3, "represented" should read -- represent --.

Col. 4, line 28, "compounds" should read -- Compounds --.

Col. 5, line 36, "Which" should read -- which --.

Col. 6, line 17, "ate" should be -- are --.

Col. 12, line 19, "Where" should be -- where --.

Col. 12, line 60, after "each recorded" please add -- in --

Signed and Sealed this

Twentieth Day of February, 1996

Attest:

BRUCE LEHMAN

*Attesting Officer*   *Commissioner of Patents and Trademarks*